(12) United States Patent
Yotsuji

(10) Patent No.: US 10,771,051 B2
(45) Date of Patent: Sep. 8, 2020

(54) SEMICONDUCTOR DEVICE AND METHOD OF GENERATING POWER ON RESET SIGNAL

(71) Applicant: LAPIS SEMICONDUCTOR CO., LTD, Yokohama (JP)

(72) Inventor: Tetsuaki Yotsuji, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/445,236

(22) Filed: Jun. 19, 2019

(65) Prior Publication Data

US 2019/0393872 A1 Dec. 26, 2019

(30) Foreign Application Priority Data

Jun. 21, 2018 (JP) .................................. 2018-118048

(51) Int. Cl.
*H03K 17/22* (2006.01)
*H03L 7/00* (2006.01)
*H03K 17/94* (2006.01)

(52) U.S. Cl.
CPC ............. *H03K 17/22* (2013.01); *H03K 17/94* (2013.01); *H03K 2017/226* (2013.01)

(58) Field of Classification Search
CPC ... H03K 17/22; H03K 17/94; H03K 2017/226
See application file for complete search history.

(56) References Cited

U.S. PATENT DOCUMENTS

| 5,070,295 | A | * | 12/1991 | Morigami | .............. | H03K 17/22 |
| | | | | | | 323/314 |
| 6,160,429 | A | * | 12/2000 | Morrill | ................ | H03K 17/145 |
| | | | | | | 327/143 |
| 6,429,705 | B1 | * | 8/2002 | Bando | .................. | H03K 17/145 |
| | | | | | | 327/143 |
| 6,914,461 | B2 | * | 7/2005 | Kwon | .................. | H03K 17/223 |
| | | | | | | 327/143 |
| 7,023,244 | B2 | * | 4/2006 | Lee | ...................... | H03K 17/223 |
| | | | | | | 327/143 |

(Continued)

FOREIGN PATENT DOCUMENTS

JP 2004128950 4/2004

Primary Examiner — Kenneth B Wells
(74) Attorney, Agent, or Firm — JCIPRNET

(57) ABSTRACT

A semiconductor device and a method of generating a power on reset signal that can reliably perform power on reset on an internal circuit and subsequently cancel the reset state regardless of environmental temperature are provided. The semiconductor device according to the disclosure includes: a voltage divider circuit dividing a power supply voltage to obtain first and second voltages having different voltage values; a first transistor receiving the first voltage at the control electrode to generate a first current; a second transistor receiving the second voltage at the control electrode to generate a second current; a current comparing part comparing the first and second currents to generate a current comparison result signal representing a comparison result; and a reset signal generating part generating a power on reset signal having a first level that prompts reset or a second level that prompts reset cancelation based on the current comparison result signal.

10 Claims, 9 Drawing Sheets

(56) References Cited

U.S. PATENT DOCUMENTS

| | | | |
|---|---|---|---|
| 7,030,668 B1* | 4/2006 | Edwards | H03K 17/223 327/143 |
| 7,274,999 B1* | 9/2007 | Saether | G01R 19/16538 702/58 |
| 7,868,668 B2* | 1/2011 | Kao | H03K 17/20 327/142 |
| 8,928,374 B2* | 1/2015 | Matsuno | H03L 5/02 327/143 |
| 2007/0046341 A1* | 3/2007 | Tanzawa | H03K 17/14 327/143 |
| 2015/0042386 A1* | 2/2015 | Bhowmik | H03K 17/223 327/143 |

\* cited by examiner

SEMICONDUCTOR DEVICE AND METHOD OF GENERATING POWER ON RESET SIGNAL

CROSS-REFERENCE TO RELATED APPLICATION

This application claims the benefit of Japan Application No. 2018-118048, filed on Jun. 21, 2018. The entirety of the above-mentioned patent application is hereby incorporated by reference herein and made a part of this specification.

BACKGROUND

Technical Field

The disclosure relates to a semiconductor device and particularly relates to a semiconductor device including a power on reset circuit and a method of generating a power on reset signal.

Description of Related Art

A semiconductor device that includes a digital circuit is provided with a power on reset circuit which resets the state of the digital circuit included in the semiconductor device when the power is on. The power on reset circuit has a signal level prompting reset immediately after the power is on, and generates a reset signal transitioning to a signal level for canceling the reset when the voltage value of the power supply voltage exceeds a predetermined threshold voltage (for example, see Japanese Laid-Open No. 2004-128950 (Patent Document 1)).

In recent years, Internet of things (IoT) has been proposed as a technology that enables processing such as collection and analysis of information data by connecting sensors, actuators, cars, buildings, etc. to a server or cloud via a network.

The radio frequency identification (RFID) tag configured by a semiconductor device, which includes a sensor, a control circuit, a wireless communication circuit, etc., and a wireless communication antenna, for example, is known as an IoT device used in IoT.

Furthermore, in order to reduce power consumption, a passive RFID tag has been released in recent years. The passive RFID tag has the function of generating the power supply voltage for operating the internal circuit included in the semiconductor device from the received radio wave and corresponds to the so-called energy harvester. Such a passive RFID tag also needs to be equipped with a power on reset circuit so as to operate its internal circuit properly.

However, the threshold voltage of the power on reset circuit described above has a so-called negative temperature characteristic that fluctuates toward the high voltage side as the ambient temperature decreases.

Also, for the passive RFID tag, the power supply voltage is generated from the received radio wave, so the voltage value of the power supply voltage fluctuates depending on the intensity of the received radio wave. For example, when the intensity of the received radio wave is low, the voltage value of the power supply voltage generated based on the received radio wave also decreases.

Thus, if the fluctuation range of the threshold voltage with respect to the temperature change is large, for example, if the temperature is low and the reception intensity is weak, the voltage value of the power supply voltage may not exceed the threshold voltage of the power on reset circuit, resulting in the problem that the reset state is not canceled.

SUMMARY

A semiconductor device according to the disclosure includes: a voltage divider circuit dividing a power supply voltage to obtain a first voltage and a second voltage having voltage values different from each other; a first transistor receiving the first voltage at a control electrode to generate a first current; a second transistor receiving the second voltage at a control electrode to generate a second current; a current comparing part comparing the first current and the second current to generate a current comparison result signal representing a comparison result; and a reset signal generating part generating a power on reset signal having a first level that prompts reset or a second level that prompts reset cancelation based on the current comparison result signal.

A generating method of a power on reset signal according to the disclosure is a method for generating a power on reset signal according to power on. The generating method includes: dividing a power supply voltage generated according to the power on to generate a first voltage and a second voltage having voltage values different from each other; supplying the first voltage to a control electrode of the first transistor and supplying the second voltage to a control electrode of the second transistor; comparing a first current flowing to the first transistor and a second current flowing to the second transistor to generate a current comparison result signal representing a comparison result; and generating a signal having a first level that prompts reset or a second level that prompts reset cancelation based on the current comparison result signal as the power on reset signal.

BRIEF DESCRIPTION OF THE DRAWINGS

FIG. 2 is a time chart showing the transition of the voltage value of the power supply voltage VDD and the waveform of the power on reset signal POR before and after the time point when the power is on.

DESCRIPTION OF THE EMBODIMENTS

Figure 1:
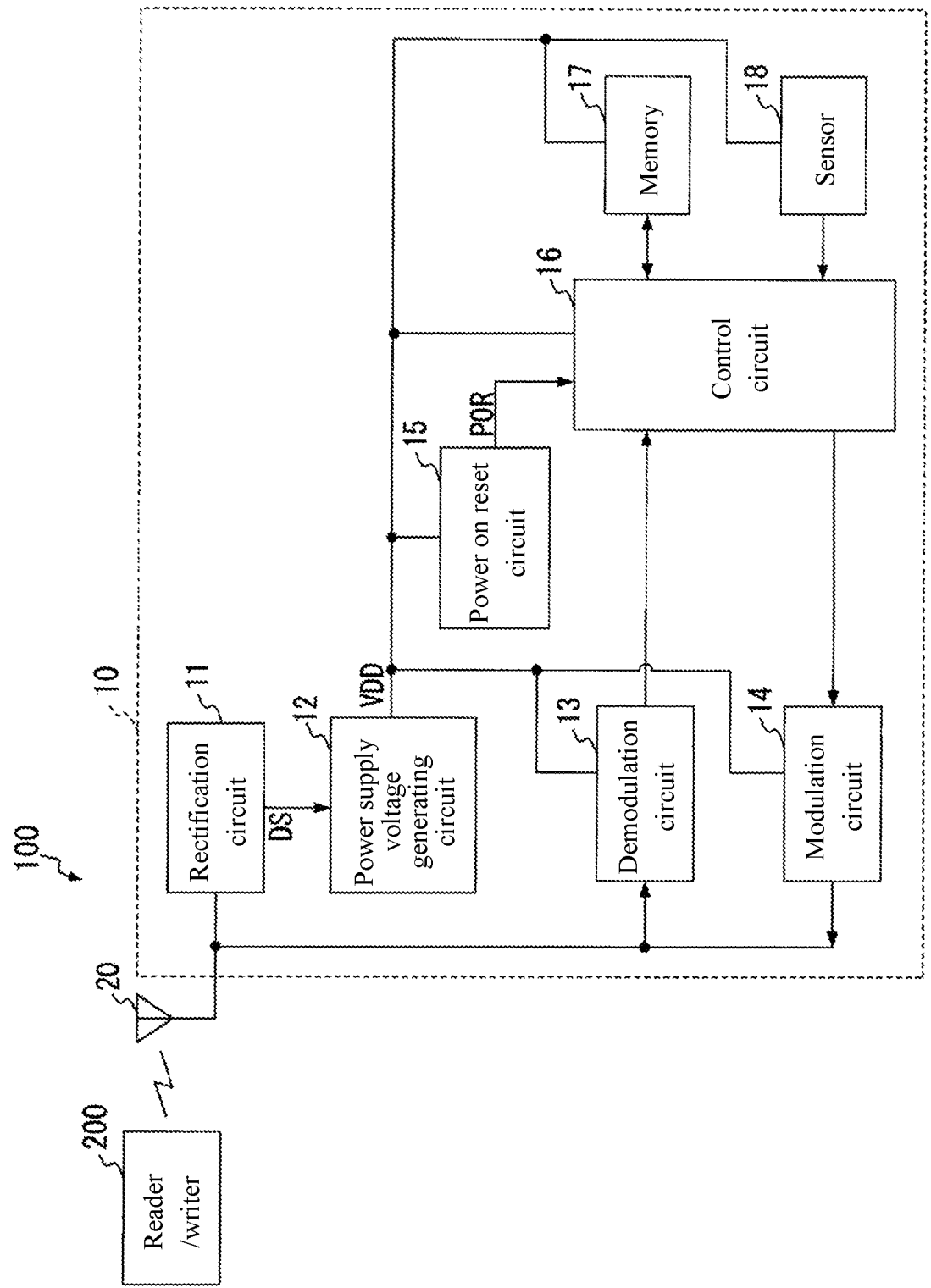
FIG. 1 is a block diagram showing a configuration of the radio frequency identification (RFID) tag 100.

The disclosure provides a semiconductor device and a method of generating a power on reset signal that can reliably perform power on reset on the internal circuit and subsequently cancel the reset state regardless of the environmental temperature.

In the disclosure, the power on reset signal, which has the first level that prompts reset when the voltage value of the power supply voltage is lower than the predetermined threshold voltage, and has the second level that prompts reset cancelation when the voltage value is equal to or higher than the threshold voltage, is generated as follows.

In other words, among the first and second voltages having different voltage values obtained by dividing the power supply voltage, the first voltage is supplied to the control electrode (gate, base) of the first transistor, and the second voltage is supplied to the control electrode of the second transistor. Then, the first current generated by the first transistor and the second current generated by the second transistor are compared with each other. Here, if the aspect ratios (or emitter area ratios) of the first and second transistors are different from each other, at the time of rise (or fall) of the power supply voltage, the relationship between the first current and the second current described above is inverted with the predetermined threshold voltage as the boundary.

Therefore, the power on reset signal having the first level that prompts reset or the second level that prompts reset cancelation is generated based on the comparison result obtained by comparing the first current and the second current as described above.

According to the configuration, when the first current and the second current are equal, the power on reset signal transitions from the first level to the second level or from the second level to the first level. Thus, the voltage value of the power supply voltage at the time when the first current and the second current are equal is the threshold voltage, which serves as the condition for switching the level of the power on reset signal.

The voltage value of the power supply voltage in the case where the first current and the second current are equal depends on the gate-source voltage (or base-emitter voltage) of the transistor and the thermal voltage. In this case, the gate-source voltage (or base-emitter voltage) of the transistor has a negative temperature characteristic, and the thermal voltage has a positive temperature characteristic. Therefore, the temperature fluctuation is canceled out by the temperature fluctuation occurring in the gate-source voltage (or base-emitter voltage) of the transistor and the temperature fluctuation occurring in the thermal voltage. As a result, the temperature fluctuation that occurs in the threshold voltage is suppressed.

Thus, according to the disclosure, it is possible to reliably perform power on reset on the internal circuit and subsequently cancel the reset state regardless of the environmental temperature.

FIG. 1 is a block diagram showing a configuration of a passive radio frequency identification (RFID) tag 100.

The RFID tag 100 receives wireless power supply from a reader/writer 200 and performs short-range wireless communication with the reader/writer 200.

As shown in FIG. 1, the RFID tag 100 includes a semiconductor device 10 and an antenna 20, wherein the semiconductor device 10 includes a rectification circuit 11, a power supply voltage generating circuit 12, a demodulation circuit 13, a modulation circuit 14, a power on reset circuit 15, a control circuit 16, a memory 17, and a sensor 18.

The antenna 20 receives a radio wave for power supply transmitted from the reader/writer 200 and supplies high frequency power corresponding to the intensity of the received radio wave to the semiconductor device 10. In addition, when the antenna 20 receives a radio wave representing a command code transmitted from the reader/writer 200, the antenna 20 supplies a high frequency signal corresponding to the command code to the semiconductor device 10. Furthermore, when the antenna 20 receives a modulation signal from the semiconductor device 10, the antenna 20 radiates a radio wave corresponding to the modulation signal.

When receiving the high frequency power from the antenna 20, the rectification circuit 11 rectifies the high frequency power and supplies an obtained DC voltage DS to the power supply voltage generating circuit 12.

The power supply voltage generating circuit 12 generates a power supply voltage VDD for operating the demodulation circuit 13, the modulation circuit 14, the power on reset circuit 15, the control circuit 16, the memory 17, and the sensor 18 based on the DC voltage DS and supplies the power supply voltage VDD to them.

By receiving the power supply voltage VDD, the demodulation circuit 13, the modulation circuit 14, the power on reset circuit 15, the control circuit 16, the memory 17, and the sensor 18 respectively perform the following operations.

When receiving the high frequency signal corresponding to the received radio wave from the antenna 20, the demodulation circuit 13 performs a demodulation process on the high frequency signal to obtain a command code and supplies it to the control circuit 16. The modulation circuit 14 generates a modulated signal obtained by modulating a carrier wave signal corresponding to the band of the above radio wave with the information data supplied from the control circuit 16 and supplies the modulated signal to the antenna 20.

The power on reset circuit 15 generates a power on reset signal POR of the logic level 0, for example, that prompts reset when the voltage value of the power supply voltage VDD is equal to or lower than a threshold voltage Vtp. Moreover, when the voltage value of the power supply voltage VDD is higher than the threshold voltage Vtp, the power on reset circuit 15 generates a power on reset signal POR of the logic level 1, for example, that prompts reset cancelation. The power on reset circuit 15 supplies the generated power on reset signal POR to the control circuit 16.

Identification information representing each RFID tag 100 as a product, for example, is stored in the memory 17 in advance. The memory 17 is a non-volatile semiconductor memory, for example, and reads the identification information stored therein according to a read command supplied from the control circuit 16 and supplies it as identification data to the control circuit 16. The sensor 18 detects, for example, natural phenomena such as temperature, humidity, illuminance, or noise level around the RFID tag 100 and mechanical, electromagnetic, thermal, acoustic, chemical properties of an artifact, and supplies sensor data representing the content of detection to the control circuit 16.

The control circuit 16 stops its own operation while the power on reset signal POR is in the state of the logic level 0 that prompts reset, and then starts the following operation when the power on reset signal POR transitions to the logic level 1 that prompts reset cancelation.

That is, the control circuit 16 reads the identification data from the memory 17 according to the command code supplied from the demodulation circuit 13, takes in the identification data, and takes in the sensor data. The control circuit 16 then supplies the identification data and the sensor data to the modulation circuit 14. When receiving the identification data or the sensor data, the modulation circuit 14 supplies a modulated signal obtained by modulating a carrier wave signal with the identification data or the sensor data to the antenna 20, so as to wirelessly transmit each data to the reader/writer 200.

Figure 2:
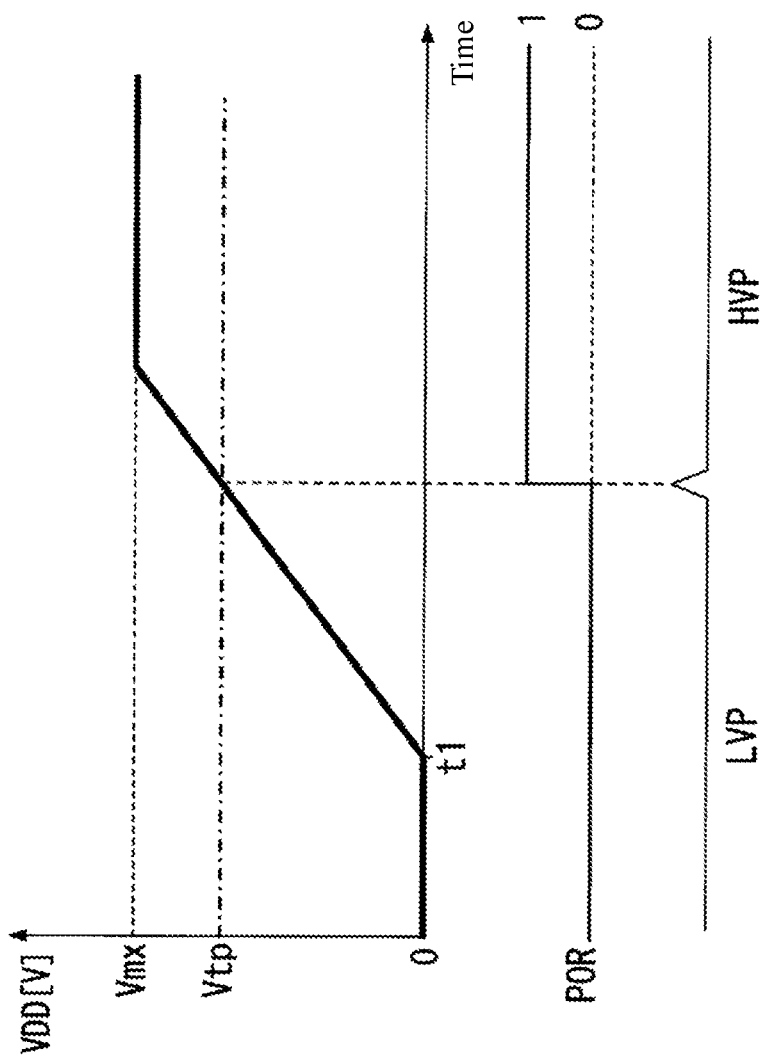

Hereinafter, the operation of the above power on reset circuit 15 will be described in detail with reference to FIG. 2. FIG. 2 is a time chart showing the transition of the voltage value of the power supply voltage VDD and the waveform of the power on reset signal POR before and after the time point when the rectification circuit 11 starts supplying the DC voltage DS to the power supply voltage generating circuit 12, that is, the time point when the power for the power supply voltage generating circuit 12 is on.

When the RFID tag 100 is present in a region where the radio wave from the reader/writer 200 does not reach, since the power supply voltage generating circuit 12 cannot receive the DC voltage DS, the voltage value of the power supply voltage VDD is 0V. Thus, the demodulation circuit 13, the modulation circuit 14, the power on reset circuit 15, the control circuit 16, the memory 17, and the sensor 18 of the RFID tag 100 are in an operation stop state.

Thereafter, when the RFID tag 100 moves to a region where the radio wave from the reader/writer 200 reaches, the rectification circuit 11 starts supplying the DC voltage DS to the power supply voltage generating circuit 12, that is, the power for the power supply voltage generating circuit 12 is turned on. Therefore, the power supply voltage generating circuit 12 starts generating the power supply voltage VDD from the power on time point t1 shown in FIG. 2. Thus, as indicated by the thick solid line in FIG. 2, the voltage value of the power supply voltage VDD gradually rises from the state of 0V and reaches the voltage value Vmx corresponding to the intensity of the received radio wave.

When the voltage value of the power supply voltage VDD is lower than the threshold voltage Vtp, the power on reset circuit 15 generates the power on reset signal POR of the logic level 0, for example, that prompts reset, as shown in FIG. 2. Then, when the voltage value of the power supply voltage VDD becomes equal to or higher than the threshold voltage Vtp, the power on reset circuit 15 transitions the power on reset signal POR to the state of the logic level 1 that prompts reset cancelation, as shown in FIG. 2.

Figure 3:
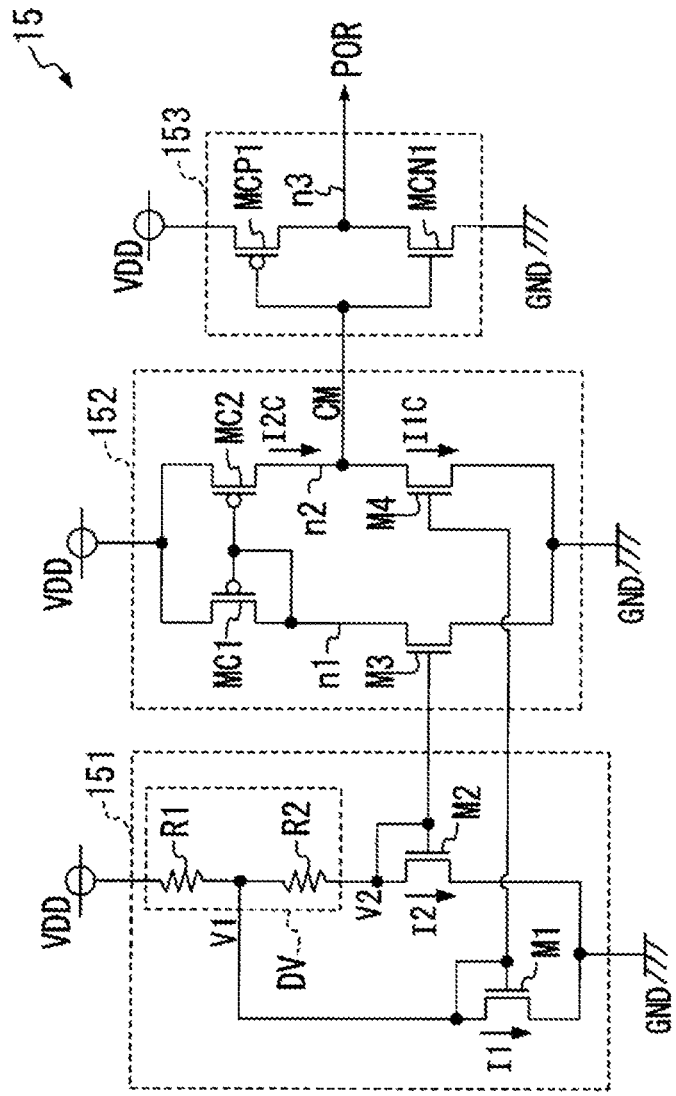
FIG. 3 is a circuit diagram showing an example of the configuration of the power on reset circuit 15.

FIG. 3 is a circuit diagram showing an example of the internal configuration of the power on reset circuit 15.

The power on reset circuit 15 includes a current generating part 151, a current comparing part 152, and a reset signal generating part 153.

The current generating part 151 includes a voltage divider circuit DV and N channel metal-oxide-semiconductor (MOS) type transistors M1 and M2. The current comparing part 152 includes P channel MOS type transistors MC1 and MC2 and N channel MOS type transistors M3 and M4. The reset signal generating part 153 includes a P channel MOS type transistor MCP1 and an N channel MOS type transistor MCN1.

In FIG. 3, the voltage divider circuit DV of the current generating part 151 includes resistors R1 and R2 that are connected in series. The power supply voltage VDD is applied to one end of the resistor R1, and the other end of the resistor R1 is connected to one end of the resistor R2, and the gate, as a control electrode, and the drain of the transistor M1.

In order to operate the transistors M1 and M2 in a weak inversion region, the resistor R1 of the voltage divider circuit DV has a high resistance value of about 10M (mega) ohm, for example. In addition, the resistor R2 has a lower resistance value than the resistor R1.

The drain and the gate of the transistor M1 are connected to the gate, as a control electrode, of the transistor M4 included in the current comparing part 152. The other end of the resistor R2 is connected to the gate, as a control electrode, and the drain of the transistor M2, and is connected to the gate, as a control electrode, of the transistor M3 included in the current comparing part 152. The ground voltage GND is applied to the sources of the transistors M1 and M2.

With this configuration, the voltage V1 generated at the connection point between the other end of the resistor R1 and one end of the resistor R2 in the voltage divider circuit DV is applied to the gate and the drain of the transistor M1, and the voltage V2 generated at the other end of the resistor R2 is applied to the gate and the drain of the transistor M2. That is, the voltage V1 obtained by dividing the power supply voltage VDD with the voltage divider circuit DV is applied to the gate and the drain of the transistor M1. Further, the voltage V2 that is lower than the voltage V1 and obtained by dividing the power supply voltage VDD with the voltage divider circuit DV is applied to the gate and the drain of the transistor M2.

As the transistors M1 and M2, the following structure is adopted. That is, regarding the ratio of gate width to gate length, the so-called aspect ratio (W/L) [W: gate width, L: gate length], the aspect ratio $(W/L)_{M2}$ of M2 is n times with respect to the aspect ratio $(W/L)_{M1}$ of M1 (n is a real number larger than 1).

The power supply voltage VDD is applied to the source of each of the transistors MC1 and MC2 of the current comparing part 152, and their gates are connected to each other. The gate and the drain of the transistor MC1 are connected to the drain of the transistor M3 via the node n1. The drain of the transistor MC2 is connected to the drain of the transistor M4 and the gate of each of the transistors MCP1 and MCN1 of the reset signal generating part 153 via the node n2. The ground voltage GND is applied to the sources of the transistors M3 and M4.

In the above configuration, a first current mirror circuit is formed by the transistor M1 of the current generating part 151 and the transistor M4 of the current comparing part 152. In addition, a second current mirror circuit is formed by the transistor M2 of the current generating part 151 and the transistor M3 of the current comparing part 152. Furthermore, in the current comparing part 152, a third current mirror circuit is formed by the transistor MC1 and the transistor MC2.

The power supply voltage VDD is applied to the source of the transistor MCP1 of the reset signal generating part 153, and its drain is connected to the drain of the transistor MCN1 via the node n3. The ground voltage GND is applied to the source of the transistor MCN1.

That is, in the reset signal generating part 153, an inverter circuit is formed by the transistors MCP1 and MCN1, and the output of the inverter circuit is outputted as the power on reset signal POR via the node n3.

The operation of the power on reset circuit 15 shown in FIG. 3 will be described below.

The currents generated by the current generating part 151, that is, the current I1 serving as the drain current flowing to the transistor M1 and the current I2 serving as the drain current flowing to the transistor M2, will be described first.

As shown in FIG. 2, in the voltage period LVP, in which the voltage value of the power supply voltage VDD is lower than the threshold voltage Vtp, before and after the power on time point t1, the resistor R1 has a high resistance of about 10M ohm, so almost no current flows through the resistors R1 and R2.

Thus, at this time, there is also a slight voltage drop at the resistor R2, and the voltage V1 applied to the gate of the transistor M1 and the voltage V2 applied to the gate of the transistor M2 become substantially equal. Therefore, the gate-source voltages of the transistors M1 and M2 also become substantially equal. In addition, since the gate-source voltage of each of the transistors M1 and M2 is lower than the threshold voltage of the transistor, the transistors M1 and M2 are in the state of operating in the weak inversion region. As a result, the current I1 flowing to the transistor M1 and the current I2 flowing to the transistor M2 both become small.

When the gate-source voltages of the transistors M1 and M2 are substantially equal, the drain current flowing to one of M1 and M2 which has the larger aspect ratio, that is, the drain current flowing to the transistor M2, becomes larger than the drain current flowing to the transistor M1.

Figure 4:
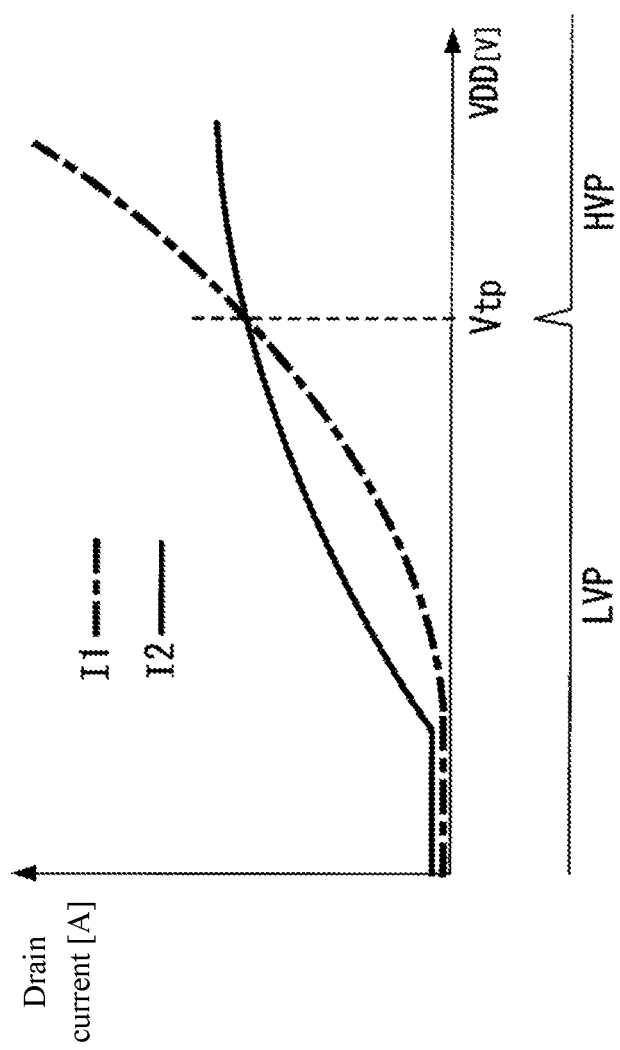
FIG. 4 is a diagram showing the transition of the currents I1 and I2 generated by the current generating part at the time of rise of the power supply voltage VDD.

That is, as shown in FIG. 2, in the low voltage period LVP in which the voltage value of the power supply voltage VDD is lower than the threshold voltage Vtp, while the currents I1 and I2 respectively flowing to the transistors M1 and M2 maintain the relationship:

$$I1<I2,$$

they increase with the increase of the power supply voltage VDD, as shown in FIG. 4.

On the other hand, as shown in FIG. 2, in the high voltage period HVP in which the voltage value of the power supply voltage VDD is equal to or higher than the threshold voltage Vtp, the currents flowing to the resistors R1 and R2 increase. At this time, the voltage drop of the resistor R2 also increases, and the voltage drop causes the transistor M1 to have a higher gate-source voltage than the transistor M2. Thus, the drain current flowing to one of transistors M1 and M2 which has the higher gate-source voltage, that is, the drain current flowing to the transistor M1, becomes larger than the drain current flowing to the transistor M2.

That is, as shown in FIG. 4, in the high voltage period HVP in which the voltage value of the power supply voltage VDD is high, the relationship between the current I1 flowing to the transistor M1 and the current I2 flowing to the transistor M2 is:

$$I1≥I2.$$

Next, the operation of comparing the currents I1 and I2 performed by the current comparing part 152 and the operation of generating a reset signal performed by the reset signal generating part 153 will be described.

Since the transistor M1 of the current generating part 151 and the transistor M4 of the current comparing part 152 form a current mirror circuit, the current I1 flowing to M1 is copied as the current I1C flowing to M4. Similarly, since the transistor M2 of the current generating part 151 and the transistor M3 of the current comparing part 152 form a current mirror circuit, the current I2 flowing to M2 is copied as the drain current of M3. At this time, a drain current equal to the drain current flowing to the transistor M3 flows to the transistor MC1 of the current comparing part 152. Here, since the transistors MC1 and MC2 form a current mirror circuit, the drain current flowing to the MC1 is copied as the current I2C flowing to MC2.

As a result, the transistor MC2 supplies the current I2C corresponding to the current I2 flowing to the transistor M2 to the node n2, and the transistor M4 draws the current I1C corresponding to the current I1 flowing to the transistor M1 from the node n2.

Thus, when the current I2C is larger than the current I1C, that is, when the current I2 is larger than the current I1, the parasitic capacitance of the node n2 is charged by the power supply voltage VDD and the node n2 reaches the state of the power supply voltage VDD. That is, at this time, the current comparing part 152 supplies a current comparison result signal CM having the power supply voltage VDD, as a signal of the logic level 1 indicating that the current I2 is larger than the current I1, to the reset signal generating part 153. Therefore, the transistor MCN1 of the reset signal generating part 153 is in the on state, and the transistor MCN1 applies the ground voltage GND representing the logic level 0 to the node n3. Thus, at this time, the reset signal generating part 153 outputs the power on reset signal POR of the logic level 0 (GND) that prompts reset via the node n3.

On the other hand, when the current I2C is equal to or less than the current I1C, that is, when the current I2 is equal to or less than the current I1, the parasitic capacitance of the node n2 is discharged, and the node n2 reaches the state of the ground voltage GND. That is, at this time, the current comparing part 152 supplies a current comparison result signal CM having the ground voltage GND, as a signal of the logic level 0 indicating that the current I2 is equal to or less than the current I1, to the reset signal generating part 153. Therefore, the transistor MCP1 of the reset signal generating part 153 is in the on state, and the transistor MCP1 applies the power supply voltage VDD representing the logic level 1 to the node n3. Thus, at this time, the reset signal generating part 153 outputs the power on reset signal POR of the logic level 1 (VDD) that prompts reset cancelation via the node n3.

That is, in the power on reset circuit 15, first, the current generating part 151 generates the following two systems of currents I1 and I2 based on the power supply voltage VDD.

In other words, when the voltage value of the power supply voltage VDD is lower than the threshold voltage Vtp, the current generating part 151 generates the currents I1 and I2 in the relationship:

$$I1<I2,$$

and when the voltage value of the power supply voltage VDD is equal to or higher than the threshold voltage, the current generating part 151 generates the currents I1 and I2 in the relationship:

$$I1≥I2.$$

Next, the current comparing part 152 compares the magnitudes of the currents I1 and I2 and supplies the current comparison result signal CM representing the magnitude comparison result to the reset signal generating part 153. In other words, when the current I2 is larger than the current I1, the current comparing part 152 supplies the current comparison result signal CM of the logic level 1 having the power supply voltage VDD to the reset signal generating part 153 via the node n2. On the other hand, when the current I2 is equal to or less than the current I1, the current comparing part 152 supplies the current comparison result signal CM of the logic level 0 having the ground voltage GND to the reset signal generating part 153 via the node n2.

Here, the reset signal generating part 153 generates the power on reset signal POR of the logic level 0 when the current comparison result signal CM is in the state of the logic level 1 (VDD), and generates the power on reset signal POR of the logic level 1 when the current comparison result signal CM is in the state of the logic level 0 (GND). That is, the reset signal generating part 153 generates a signal obtained by inverting the phase of the current comparison result signal CM as the power on reset signal POR.

In short, as shown in FIG. 2, the power on reset circuit 15 generates the power on reset signal POR of the logic level 0 that prompts reset when the voltage value of the power supply voltage VDD is lower than the threshold voltage Vtp. On the other hand, when the voltage value of the power supply voltage VDD is equal to or higher than the threshold voltage Vtp, the power on reset circuit 15 generates the power on reset signal POR of the logic level 1 that prompts reset cancelation.

In the power on reset circuit 15, the threshold voltage Vtp, which is the condition for transitioning the logic level of the power on reset signal POR from "0" to "1" (or from "1" to "0"), is set by the currents I1 and I2 described above.

That is, as shown in FIG. 4, the voltage value of the power supply voltage VDD at the time when the current I1 flowing to the transistor M1 and the current I2 flowing to the transistor M2 become equal to each other is the threshold voltage Vtp.

Here, since the transistors M1 and M2 operate in the weak inversion region, their drain current $I_d$ is expressed as follows.

$$I_d = I_0 \frac{W}{L} \exp\left(\frac{V_{GS} - V_{TH}}{\eta V_T}\right) \quad \text{[Equation 1]}$$

$I_0$: process dependent current
W: gate width (channel width)
L: gate length (channel length)
$V_{GS}$: gate-source voltage
$V_{TH}$: threshold voltage of MOS transistor
η: process dependent constant of weak inversion region
$V_T$: thermal voltage In addition, the process dependent current $I_0$ and the thermal voltage $V_T$ are respectively expressed as follows.

$$I_0 = \mu \cdot C_{OX}(\eta-1)V_T^2$$

$$V_T = k_B \cdot T/q$$

μ: carrier mobility
$C_{OX}$: gate oxide film capacitance of MOS transistor
$k_B$: Boltzmann's constant
q: charge of electron
T: absolute temperature When the equation representing the above drain current $I_d$ is converted into an equation representing the gate-source voltage $V_{GS}$, $$V_{GS} = V_{TH} + \eta V_T \cdot \ln\left(\frac{L}{W} \cdot \frac{I_d}{I_0}\right). \quad \text{[Equation 2]}$$

Further, according to the circuit of the current generating part 151 shown in FIG. 3, the current I2 flowing to the transistor M2 is expressed as follows.

$$I2 = \quad \text{[Equation 3]}$$

-continued $$\frac{V_{GS1} - V_{GS2}}{R2} = \frac{\eta V_T}{R2} \cdot \ln\left\{\frac{(W/L)_{M2}}{(W/L)_{M1}} \cdot \frac{I1}{I2}\right\} = \frac{\eta V_T}{R2} \cdot \ln\left(n \cdot \frac{I1}{I2}\right)$$

$(W/L)_{M1}$: aspect ratio of transistor M1
$(W/L)_{M2}$: aspect ratio of transistor M2
$V_{GS1}$: gate-source voltage of transistor M1
$V_{GS2}$: gate-source voltage of transistor M2

Also, the power supply voltage VDD is expressed as follows from the circuit diagram of FIG. 3.

$$VDD = V_{GS1} + R1(I1+I2)$$

Here, at the time point when the logic level of the power on reset signal POR is inverted, the currents I1 and I2 become:

$$I1 = I2.$$

Therefore, when "I1" of the above equation representing the power supply voltage VDD is replaced with "I2" and further the "I2" is replaced with the above equation representing the current I2, the voltage value of the power supply voltage VDD at the time when the current I1 and the current I2 are equal, that is, the threshold voltage Vtp, is expressed as follows.

$$V_{tp} = V_{GS1} + 2 \cdot R1 \cdot I2 = V_{GS1} + 2\eta V_T \cdot \frac{R1}{R2} \cdot \ln(n) \quad \text{[Equation 4]}$$

Here, the gate-source voltage $V_{GS1}$, which is the first term of the above equation representing the threshold voltage Vtp, has a so-called negative temperature characteristic that fluctuates toward the low voltage side as the ambient temperature increases. Further, the thermal voltage $V_T$ included in the second term of the equation has a so-called positive temperature characteristic that fluctuates toward the high voltage side as the ambient temperature increases.

Since the temperature fluctuation is canceled out by the temperature fluctuation occurring in the gate-source voltage $V_{GS1}$ and the temperature fluctuation occurring in the thermal voltage $V_T$, consequently the temperature fluctuation occurring in the threshold voltage Vtp is suppressed. Specifically, the power on reset circuit 15 shown in FIG. 3 is manufactured in a form that the resistance ratio between the resistors R1 and R2 and the ratio "n" between the aspect ratio $(W/L)_{M1}$ of the transistor M1 and the aspect ratio $(W/L)_{M2}$ of the transistor M2 are set so that the temperature fluctuation is canceled out.

Thus, according to the power on reset circuit 15 shown in FIG. 3, it is possible to generate a power on reset signal that reliably prompts reset according to power on and subsequently cancels the reset state regardless of the environmental temperature.

Figure 5:
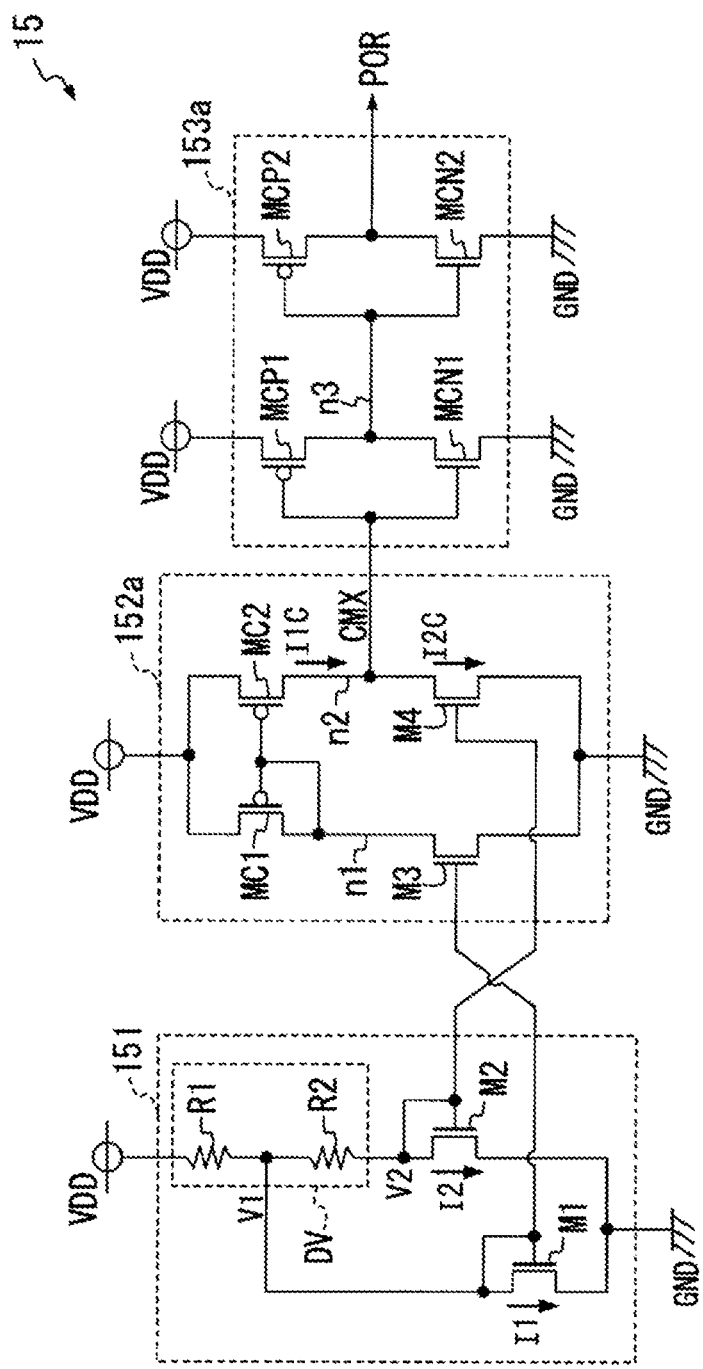
FIG. 5 is a circuit diagram showing a modified example of the power on reset circuit 15.

FIG. 5 is a circuit diagram showing a modified example of the power on reset circuit 15 shown in FIG. 3. The power on reset circuit 15 shown in FIG. 5 adopts a current comparing part 152a and a reset signal generating part 153a in place of the current comparing part 152 and the reset signal generating part 153, and the current generating part 151 is the same as that shown in FIG. 3.

In addition, as shown in FIG. 5, in the current comparing part 152a, the connection configuration of the transistors M3, M4, MC1, and MC2 is the same as that shown in FIG. 3. However, in the current comparing part 152a, the gate of the transistor M1, instead of M2, of the current generating part 151 is connected to the gate of the transistor M3, and the gate of the transistor M2 is connected to the gate of the transistor M4.

Thus, in the current comparing part 152a, the transistor MC2 supplies the current I1C corresponding to the current I1 flowing to the transistor M1 to the node n2, and the transistor M4 draws the current I2C corresponding to the current I2 flowing to the transistor M2 from the node n2.

Therefore, when the current I2 is larger than the current I1, the current comparing part 152a supplies the current comparison result signal CMX of the logic level 0 (GND) to the reset signal generating part 153a. On the other hand, when the current I2 is equal to or less than the current I1, the current comparison result signal CMX of the logic level 1 (VDD) is supplied to the reset signal generating part 153a.

Thus, regarding the current comparison result signal CMX, as compared with the current comparison result signal CM, the value of logic level corresponding to the comparison result of the currents I1 and I2 is inverted.

In the reset signal generating part 153a shown in FIG. 5, the second inverter comprising the P channel MOS type transistor MCP2 and the N channel MOS type transistor MCN2 is provided downstream of the first inverter comprising the transistors MCP1 and MCN1. In other words, the output signal of the first inverter (MCP1 and MCN1) is received via the node n3 by the second inverter (MCP2 and MCN2), and a signal obtained by inverting the logic level of the output signal is outputted as the power on reset signal POR.

According to the circuit configuration shown in FIG. 5, as in the case of adopting the configuration shown in FIG. 3, it is possible to reliably perform power on reset that prompts reset according to power on and subsequently cancels the reset regardless of the environmental temperature.

In FIG. 3 and FIG. 5, all the transistors of the power on reset circuit 15 are configured by MOS type transistors. However, bipolar type transistors may be adopted as the transistors M1 to M4.

Figure 6:
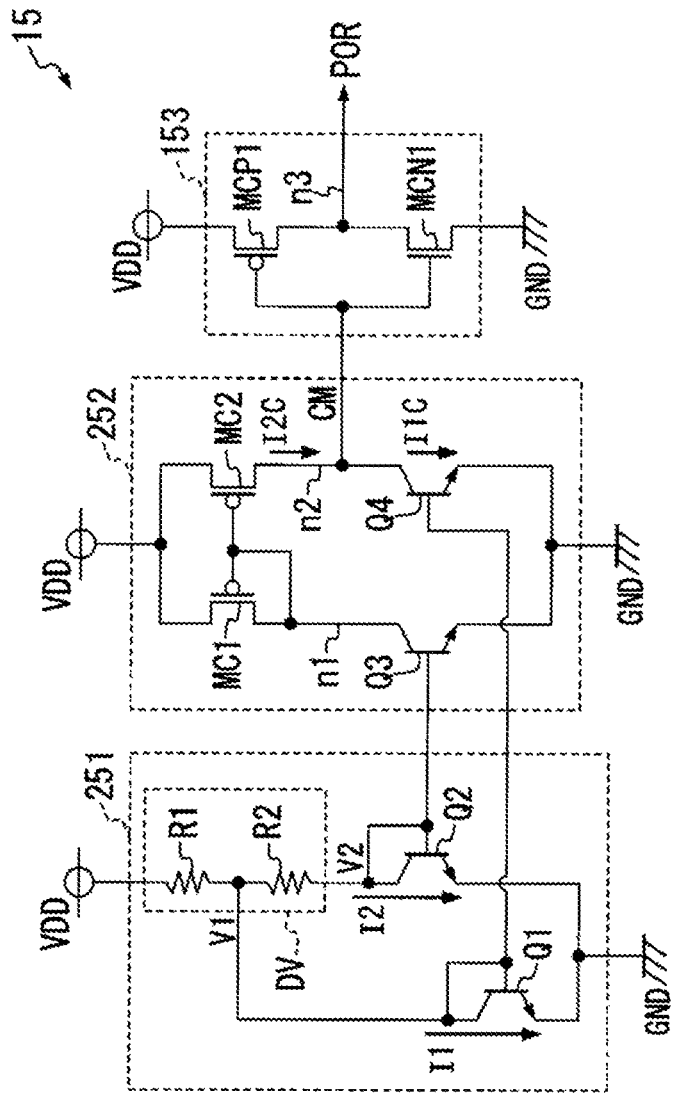
FIG. 6 is a circuit diagram showing another configuration of the power on reset circuit 15.
Figure 7:
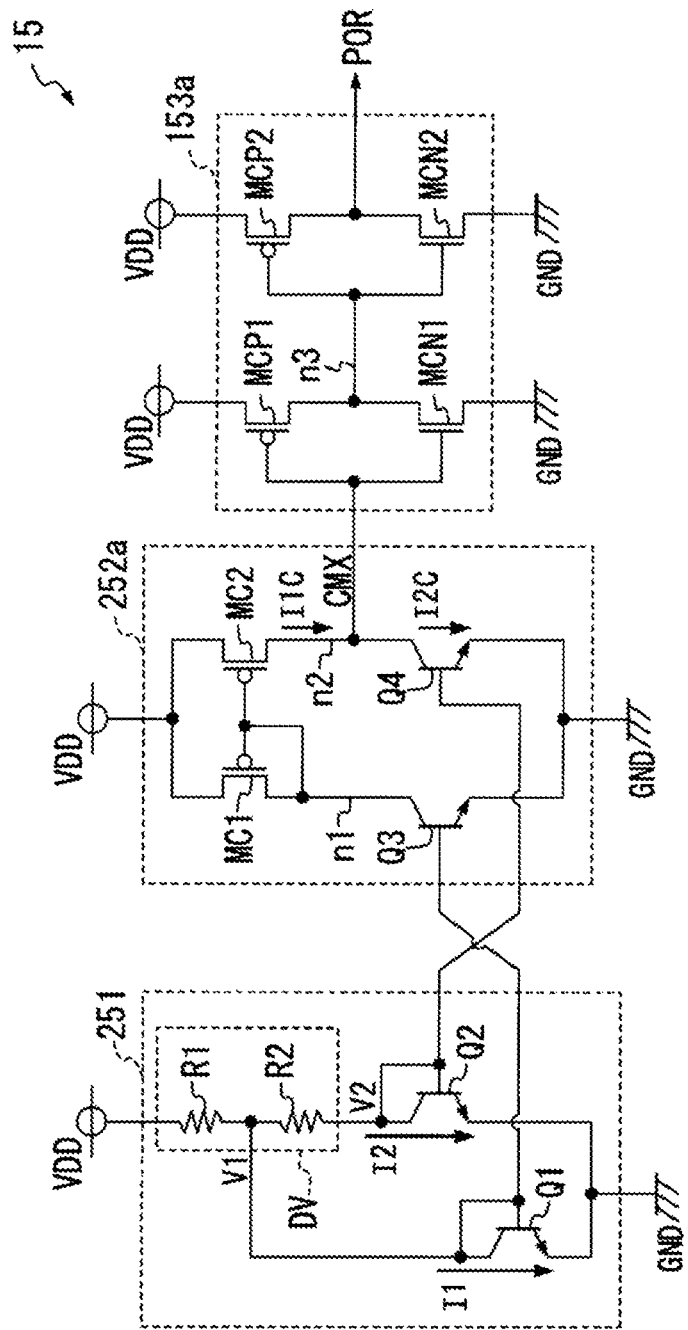
FIG. 7 is a circuit diagram showing a modified example of the power on reset circuit 15 shown in FIG. 6.

FIG. 6 is a circuit diagram showing another configuration of the power on reset circuit 15 shown in FIG. 3 which is made in view of the above point, and FIG. 7 is a circuit diagram showing another configuration of the power on reset circuit 15 shown in FIG. 5.

In the configurations shown in FIG. 6 and FIG. 7, a current generating part 251 is adopted in place of the current generating part 151, and current comparing parts 252 and 252a are adopted in place of the current comparing parts 152 and 152a. In this case, the reset signal generating parts 153 and 153a are the same as those shown in FIG. 3 and FIG. 5.

The current generating part 251 has the same circuit configuration as the current generating part 151 shown in FIG. 3 and FIG. 5 except that the MOS type transistors M1 and M2 are replaced with bipolar NPN type transistors Q1 and Q2. Similarly, the current comparing parts 252 and 252a have the same circuit configuration as the current comparing parts 252 and 252a shown in FIG. 3 and FIG. 5 except that the MOS type transistors M3 and M4 are replaced with bipolar NPN type transistors Q3 and Q4.

The current generating part 251 shown in FIG. 6 and FIG. 7 includes a voltage divider circuit DV (R1 and R2) similar to that of the current generating part 151. In this case, one end of the resistor R1 is applied with the power supply voltage VDD, and the other end of the resistor R1 is connected to the base that serves as a control electrode and the collector of the transistor Q1. The collector and the base of the transistor Q1 are connected to the base that serves as a control electrode of the transistor Q4 (Q3) included in the current comparing part 252 (252a). In addition, the other end of the resistor R2 is connected to the base that serves as a control electrode and the collector of the transistor Q2, and connected to the base of the transistor Q3 (Q4) of the current comparing part 252 (252a). The ground voltage GND is applied to the emitters of the transistors Q1 and Q2.

Further, as shown in FIG. 6 and FIG. 7, the ground voltage GND is applied to the emitters of the transistors Q3 and Q4 of the current comparing parts 252 and 252a. The collector of the transistor Q3 is connected to the gates of the MOS type transistors MC1 and MC2 and the drain of the transistor MC1 via the node n1. The collector of the transistor Q4 is connected to the drain of the transistor MC2 and the gates of the MOS type transistors MCP1 and MCN1 of the reset signal generating parts 153 and 153a via the node n2.

As shown in FIG. 6 and FIG. 7, when MOS type transistors and bipolar type transistors are both present in one semiconductor chip, the semiconductor chip adopts a triple well structure obtained by a CMOS process, for example.

Figure 8:
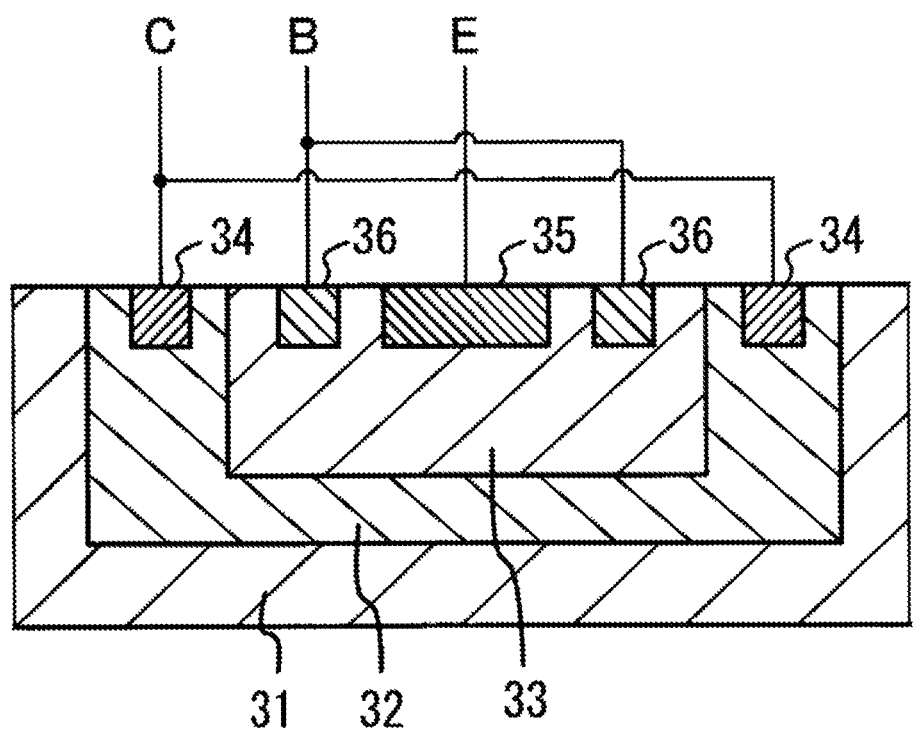
FIG. 8 is a cross-sectional view showing the structure of the bipolar NPN type transistors formed on a semiconductor chip having a triple well structure.
Figure 9:
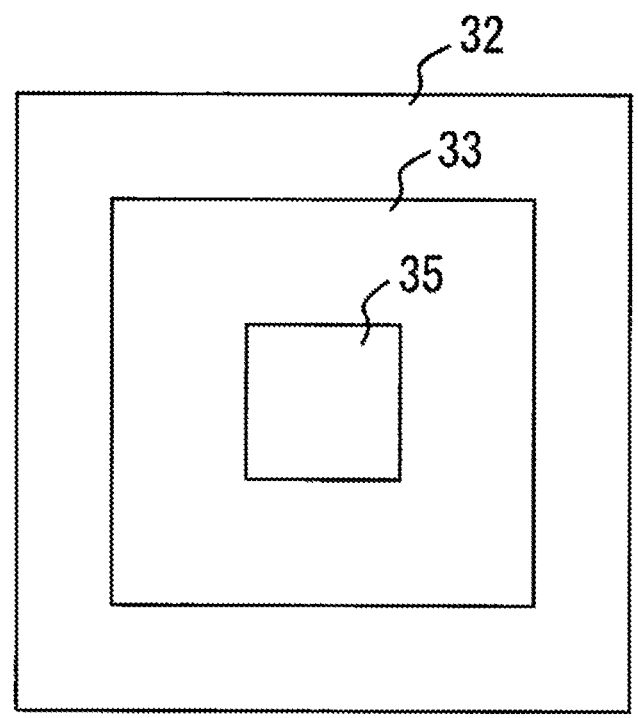
FIG. 9 is a top view of the formation regions of the bipolar NPN type transistors shown in FIG. 8 as viewed from above the semiconductor chip.

FIG. 8 is a cross-sectional view showing the structure of bipolar NPN type transistors (Q1 to Q4) formed in a semiconductor chip having a triple well structure, and FIG. 9 is a top view of the formation regions of the bipolar NPN type transistors as viewed from above the semiconductor chip.

As shown in FIG. 8, each bipolar NPN type transistor is formed in the n-type well 32 formed in the p-type semiconductor substrate 31. On the surface portion of the well 32, the n-type high concentration diffusion region 34 serving as the collector C of the transistor, and the p-type well 33 are formed. On the surface portion of the p-type well 33, the n-type high concentration diffusion region 35 serving as the emitter E of the transistor, and the p-type high concentration diffusion region 36 serving as the base B of the transistor are formed.

Here, the area of the emitter region of the transistor Q2, that is, the area of the high concentration diffusion region 35 as viewed from above the semiconductor chip as shown in FIG. 9, is n times the area of the emitter region of the transistor Q1 (n is a real number larger than 1).

The operation will be described below by extracting the power on reset circuit 15 shown in FIG. 6 among FIG. 6 and FIG. 7.

First, the current generated by the current generating part 251, that is, the current I1 flowing to the transistor Q1 and the current I2 flowing to the transistor Q2, will be described.

The current I1 actually flowing to the transistor Q1 in the circuit shown in FIG. 6 is obtained by adding the base current $I_{B1}$ flowing to the base of the transistor Q1 and the base current $I_{B4}$ flowing to the base of the transistor Q4 to the collector current $I_{C1}$ of the transistor Q1. Similarly, the current I2 flowing to the transistor Q2 is obtained by adding the base current $I_{B2}$ flowing to the base of the transistor Q2 and the base current $I_{B3}$ flowing to the base of the transistor Q3 to the collector current $I_{C2}$ of the transistor Q2.

However, since these base currents $I_{B1}$ to $I_{B4}$ are extremely small compared with the collector currents $I_{C1}$ and $I_{C2}$, hereinafter, the collector current $I_{C1}$ will be described as the current I1 flowing to the transistor Q1 and the collector current $I_{C2}$ will be described as the current I2 flowing to the transistor Q2.

As shown in FIG. 2, in the voltage period LVP in which the voltage value of the power supply voltage VDD is lower than the threshold voltage Vtp, almost no current flows through the resistors R1 and R2 shown in FIG. 6, as in the circuit shown in FIG. 3.

Thus, at this time, there is also a slight voltage drop at the resistor R2, and the base-emitter voltages of the transistors Q1 and Q2 are also substantially the same.

When the base-emitter voltages of the transistors Q1 and Q2 are substantially equal, the collector current flowing to the one having the larger emitter area, that is, the collector current flowing to the transistor Q2, is larger than the collector current flowing to the transistor Q1.

That is, as shown in FIG. 2, in the low voltage period LVP in which the voltage value of the power supply voltage VDD is low, while the currents I1 and I2 respectively flowing to the transistors Q1 and Q2 maintain the relationship:

$$I1<I2,$$

they increase with the increase of the power supply voltage VDD.

On the other hand, as shown in FIG. 2, in the high voltage period HVP in which the voltage value of the power supply voltage VDD is equal to or higher than the threshold voltage Vtp, the currents flowing to the resistors R1 and R2 increase. At this time, the voltage drop of the resistor R2 also increases, and the voltage drop causes the transistor Q1 to have a higher base-emitter voltage than the transistor Q2. Thus, a collector current larger than that of the transistor Q2 flows in the transistor Q1 that has the higher base-emitter voltage.

That is, in the high voltage period HVP in which the voltage value of the power supply voltage VDD is high, the relationship between the current I1 flowing to the transistor Q1 and the current I2 flowing to the transistor Q2 is:

$$I1 \geq I2.$$

Next, the operation of comparing the magnitudes of the currents I1 and I2 performed by the current comparing part 252 and the operation of generating the reset signal performed by the reset signal generating part 153 will be described.

Since the transistor Q1 of the current generating part 251 and the transistor Q4 of the current comparing part 252 form a current mirror circuit, the current I1 flowing to Q1 is copied as the current I1C flowing to Q4. Similarly, since the transistor Q2 of the current generating part 251 and the transistor Q3 of the current comparing part 252 form a current mirror circuit, the current I2 flowing to Q2 is copied as the collector current flowing to Q3. At this time, a drain current equal to the collector current flowing to the transistor Q3 flows to the transistor MC1 of the current comparing part 252. Here, since the transistors MC1 and MC2 form a current mirror circuit, the drain current flowing to MC1 is copied as the current I2C flowing to MC2.

As a result, the transistor MC2 supplies the current I2C corresponding to the current I2 flowing to the transistor Q2 to the node n2, and the transistor Q4 draws the current I1C corresponding to the current I1 flowing to the transistor Q1 from the node n2.

Thus, when the current I2C is larger than the current I1C, that is, when the current I2 is larger than the current I1, the parasitic capacitance of the node n2 is charged by the power supply voltage VDD, and the node n2 reaches the state of the power supply voltage VDD. That is, at this time, the current comparing part 252 supplies a current comparison result signal CM having the power supply voltage VDD, as a signal of the logic level 1 indicating that the current I2 is larger than the current I1, to the reset signal generating part 153. Therefore, the transistor MCN1 of the reset signal generating part 153 is in the on state, and the transistor MCN1 applies the ground voltage GND representing the logic level 0 to the node n3. Thus, at this time, the reset signal generating part 153 outputs the power on reset signal POR of the logic level 0 (GND) that prompts reset via the node n3.

On the other hand, when the current I2C is equal to or less than the current I1C, that is, when the current I2 is equal to or less than the current I1, the parasitic capacitance of the node n2 is discharged, and the node n2 reaches the state of the ground voltage GND. That is, at this time, the current comparing part 252 supplies the current comparison result signal CM having the ground voltage GND, as a signal of the logic level 0 indicating that the current I2 is equal to or less than the current I1, to the reset signal generating part 153. Therefore, the transistor MCP1 of the reset signal generating part 153 is in the on state, and the transistor MCP1 applies the power supply voltage VDD representing the logic level 1 to the node n3. Thus, at this time, the reset signal generating part 153 outputs the power on reset signal POR of the logic level 1 (VDD) that prompts reset cancelation via the node n3.

That is, in the power on reset circuit 15 shown in FIG. 6, the current generating part 251 generates the following two systems of currents I1 and I2 corresponding to the voltage value of the power supply voltage VDD.

At this time, when the voltage value of the power supply voltage VDD is lower than the threshold voltage, the current generating part 251 generates the currents I1 and I2 in the relationship:

$$I1<I2,$$

and when the voltage value of the power supply voltage VDD is equal to or higher than the threshold voltage, the current generating part 251 generates the currents I1 and I2 in the relationship:

$$I1 \geq I2.$$

Next, the current comparing part 252 compares the magnitudes of the currents I1 and I2 and supplies the current comparison result signal CM representing the magnitude comparison result to the reset signal generating part 153.

In other words, when the current I2 is larger than the current I1, the current comparing part 252 supplies the current comparison result signal CM of the logic level 1 having the power supply voltage VDD to the reset signal generating part 153 via the node n2. On the other hand, when the current I2 is equal to or less than the current I1, the current comparing part 252 supplies the current comparison result signal CM of the logic level 0 having the ground voltage GND to the reset signal generating part 153 via the node n2.

Here, the reset signal generating part 153 generates the power on reset signal POR of the logic level 0 when the current comparison result signal CM is in the state of the logic level 1 (VDD), and generates the power on reset signal POR of the logic level 1 when the current comparison result signal CM is in the state of the logic level 0 (GND).

Even in the power on reset circuit 15 having the configuration shown in FIG. 6, the threshold voltage Vtp, which is the condition for transitioning the logic level of the power on reset signal POR from "0" to "1" (or from "1" to "0"), is set by the currents I1 and I2 described above.

That is, the voltage value of the power supply voltage VDD at the time when the current I1 flowing to the transistor Q1 and the current I2 flowing to the transistor Q2 become equal to each other is the threshold voltage Vtp.

Here, the collector current $I_C$ flowing to the bipolar NPN type transistors Q1 and Q2 is expressed as follows.

$$I_C = I_E - I_B \approx I_E = I_S \cdot [\exp(V_{BE}/N_T) - 1] \approx I_S \cdot \exp(V_{BE}/N_T)$$

$I_E$: emitter current
$I_B$: base current
$V_{BE}$: base-emitter voltage
$V_T$: thermal voltage
$I_S$: saturation current The thermal voltage $V_T$ is expressed as follows.

$$V_T = k_B \cdot T/q$$

$k_B$: Boltzmann's constant
q: charge of electron
T: absolute temperature

When the equation representing the above collector current $I_C$ is converted into an equation representing the base-emitter voltage $V_{BE}$, $$V_{BE} = V_T \cdot \ln(I_C/I_S)$$

$$I_S \propto A_E$$

$A_E$: emitter area.

Further, according to the circuit of the current generating part 251 shown in FIG. 6, the current I2 serving as the collector current flowing to the transistor Q2 is expressed as follows.

$$I2 = \frac{V_{BE1} - V_{BE2}}{R2} = \frac{V_T}{R2} \cdot \ln\left(\frac{I_{S2}}{I_{S1}} \cdot \frac{I1}{I2}\right) = \frac{V_T}{R2} \cdot \ln\left(n \cdot \frac{I1}{I2}\right) \quad \text{[Equation 5]}$$

$V_{BE1}$: base-emitter voltage of transistor Q1
$V_{BE2}$: base-emitter voltage of transistor Q2
$I_{S1}$: saturation current of transistor Q1
$I_{S2}$: saturation current of transistor Q2
n: emitter area ratio of Q2 and Q1

Also, the power supply voltage VDD is expressed as follows from the circuit diagram of FIG. 6.

$$VDD = V_{BE1} + R1(I1 + I2)$$

Here, at the time point when the logic level of the power on reset signal POR is inverted, the currents I1 and I2 become:

$$I1 = I2.$$

Therefore, when "I1" of the above equation representing the power supply voltage VDD is replaced with "I2" and further the "I2" is replaced with the above equation representing the current I2, the voltage value of the power supply voltage VDD at the time when the current I1 and the current I2 are equal, that is, the threshold voltage Vtp, is expressed as follows.

$$V_{tp} = V_{BE1} + 2 \cdot R1 \cdot I2 = V_{BE1} + 2V_T \cdot \frac{R1}{R2} \cdot \ln(n) \quad \text{[Equation 6]}$$

Here, the base-emitter voltage $V_{BE1}$, which is the first term of the above equation representing the threshold voltage Vtp, has a so-called negative temperature characteristic that fluctuates toward the low voltage side as the ambient temperature increases. Further, the thermal voltage $V_T$ included in the second term of the equation has a so-called positive temperature characteristic that fluctuates toward the high voltage side as the ambient temperature increases.

That is, since the temperature fluctuation is canceled out by the temperature fluctuation occurring in the base-emitter voltage $V_{BE1}$ and the temperature fluctuation occurring in the thermal voltage $V_T$, consequently the temperature fluctuation occurring in the threshold voltage Vtp is suppressed. Specifically, the power on reset circuit 15 shown in FIG. 6 is manufactured in a form that the resistance ratio between the resistors R1 and R2 and the emitter area ratio "n" between the transistors Q1 and Q2 are set so that the temperature fluctuation is canceled out.

Further, according to the configuration that adopts bipolar NPN type transistors as the transistors Q1 and Q2, as shown in FIG. 6, as apparent from the above-mentioned equation representing the threshold voltage Vtp, there is no variation factor associated with manufacturing.

Thus, when the configuration of the power on reset circuit 15 shown in FIG. 6 is adopted, it is possible to generate a power on reset signal that reliably prompts reset according to power on and subsequently cancels the reset regardless of manufacturing variation and environmental temperature.

In short, as a semiconductor device including a power on reset circuit. a device including the voltage divider circuit, the first and second transistors, the current comparing part, and the reset signal generating part described below may be adopted.

That is, the voltage divider circuit (R1, R2) divides the power supply voltage (VDD) to obtain a first voltage (V1) and a second voltage (V2) having voltage values different from each other. The first transistor (M1 or Q1) receives the first voltage at the control electrode (gate or base) to generate a first current (I1). The second transistor (M2 or Q2) receives the second voltage at the control electrode (gate or base) to generate a second current (I2). The current comparing part (152, 152a, 252, 252a) compares the first current and the second current to generate a current comparison result signal (CM, CMX) representing the comparison result. The reset signal generating part (153, 153a) generates a power on reset signal (POR) having a first level that prompts reset or a second level that prompts reset cancelation based on the current comparison result signal.

What is claimed is:
1. A semiconductor device, comprising:
a voltage divider circuit dividing a power supply voltage to obtain a first voltage and a second voltage having voltage values different from each other;
a first transistor receiving the first voltage at a control electrode to generate a first current;
a second transistor receiving the second voltage at a control electrode to generate a second current, wherein the first transistor and the second transistor are metal oxide semiconductor (MOS) transistors that have aspect ratios different from each other when a ratio of a gate width to a gate length (gate width/gate length) is set as the aspect ratio;
a current comparing part comparing the first current and the second current to generate a current comparison result signal representing a comparison result; and
a reset signal generating part generating a power on reset signal having a first level that prompts reset or a second level that prompts reset cancelation based on the current comparison result signal,
wherein the current comparing part comprises:
a third transistor having a gate connected to the gate of the second transistor and causing a current corresponding to the second current to flow to a first node;
a current mirror circuit copying the current flowing to the first node and causing the copied current to flow to a second node; and a fourth transistor having a gate connected to the gate of the first transistor and drawing a current corresponding to the first current from the second node, wherein the current comparing part supplies a signal representing a voltage of the second node as a signal level as the current comparison result signal to the reset signal generating part, and the reset signal generating part comprises at least one inverter that outputs a signal obtained by inverting a phase of the current comparison result signal or inverting a phase of the signal with an inverted phase as the power on reset signal.

2. The semiconductor device according to claim 1, wherein the first voltage is higher than the second voltage, and the aspect ratio of the first transistor is less than the aspect ratio of the second transistor.

3. The semiconductor device according to claim 1, wherein the voltage divider circuit comprises:

a first resistor receiving the power supply voltage at one end and obtaining a voltage at an other end as the first voltage; and a second resistor having one end connected to the other end of the first resistor and obtaining a voltage at an other end as the second voltage, wherein the first resistor has a resistance value that causes the first transistor and the second transistor to operate in a weak inversion region.

4. The semiconductor device according to claim 1, wherein the first transistor receives the first voltage at a gate and a drain of the first transistor and generates a drain current corresponding to the first voltage as the first current, and the second transistor receives the second voltage at a gate and a drain of the second transistor and generates a drain current corresponding to the second voltage as the second current.

5. The semiconductor device according to claim 1, the reset signal generating part comprises:

a first inverter outputting a signal obtained by inverting a phase of the current comparison result signal; and a second inverter outputting a signal obtained by inverting a phase of the signal outputted from the first inverter as the power on reset signal.

6. A semiconductor device according to claim 1, comprising:

a voltage divider circuit dividing a power supply voltage to obtain a first voltage and a second voltage having voltage values different from each other;

a first transistor receiving the first voltage at a control electrode to generate a first current;

a second transistor receiving the second voltage at a control electrode to generate a second current, wherein the first transistor and the second transistor are bipolar transistors having emitter areas different from each other;

a current comparing part comparing the first current and the second current to generate a current comparison result signal representing a comparison result; and a reset signal generating part generating a power on reset signal having a first level that prompts reset or a second level that prompts reset cancelation based on the current comparison result signal, wherein the current comparing part comprises:

a third transistor having a base connected to the base of the second transistor and causing a current corresponding to the second current to flow to a first node;

a current mirror circuit copying the current flowing to the first node and causing the copied current to flow to a second node; and a fourth transistor having a base connected to the base of the first transistor and drawing a current corresponding to the first current from the second node, wherein the current comparing part supplies a signal representing a voltage of the second node as a signal level as the current comparison result signal to the reset signal generating part, and the reset signal generating part comprises at least one inverter that outputs a signal obtained by inverting a phase of the current comparison result signal or inverting a phase of the signal with an inverted phase as the power on reset signal.

7. The semiconductor device according to claim 6, wherein the first voltage is higher than the second voltage, and the emitter area of the first transistor is smaller than the emitter area of the second transistor.

8. The semiconductor device according to claim 6, wherein the voltage divider circuit comprises:

a first resistor receiving the power supply voltage at one end and obtaining a voltage at an other end as the first voltage; and a second resistor having one end connected to the other end of the first resistor and obtaining a voltage at an other end as the second voltage.

9. The semiconductor device according to claim 6, wherein the first transistor receives the first voltage at a base and a collector of the first transistor and generates a collector current corresponding to the first voltage as the first current, and the second transistor receives the second voltage at a base and a collector of the second transistor and generates a collector current corresponding to the second voltage as the second current.

10. The semiconductor device according to claim 6, wherein the reset signal generating part comprises:

a first inverter outputting a signal obtained by inverting a phase of the current comparison result signal; and a second inverter outputting a signal obtained by inverting a phase of the signal outputted from the first inverter as the power on reset signal.

* * * * *